United States Patent [19]

Anderson et al.

[11] Patent Number: 5,142,385
[45] Date of Patent: Aug. 25, 1992

[54] HOLOGRAPHIC LITHOGRAPHY

[75] Inventors: Erik H. Anderson, Lake Peekskill, N.Y.; Henry I. Smith, Sudbury; Mark L. Schattenburg, Brookline, both of Mass.

[73] Assignee: Massachusetts Institute of Technology, Cambridge, Mass.

[21] Appl. No.: 643,141

[22] Filed: Jan. 9, 1991

Related U.S. Application Data

[63] Continuation of Ser. No. 381,597, Jul. 18, 1989, abandoned.

[51] Int. Cl.⁵ .................................................. G03H 1/10
[52] U.S. Cl. ...................................... 369/10; 359/1; 359/30; 250/201.9
[58] Field of Search ................ 350/3.6, 3.67, 3.74, 350/3.83, 3.89, 162.17; 250/201.9

[56] References Cited

U.S. PATENT DOCUMENTS

| | | | |
|---|---|---|---|
| 3,622,794 | 11/1971 | Pond | 250/201.9 |
| 3,632,214 | 1/1972 | Chang et al. | 350/3.67 |
| 3,659,947 | 5/1972 | Neumann | 250/201.9 |
| 3,923,400 | 12/1975 | Hardy | 356/349 |
| 4,289,403 | 9/1981 | Allington | 356/349 |
| 4,674,824 | 6/1987 | Goodman et al. | 350/3.64 |
| 4,786,124 | 11/1988 | Stone et al. | 350/162.17 |
| 4,963,725 | 10/1990 | Hong et al. | 250/201.9 |

Primary Examiner—Bruce Y. Arnold
Assistant Examiner—J. P. Ryan
Attorney, Agent, or Firm—Fish & Richardson

[57] ABSTRACT

First and second coherent beams illuminate a common area on an exposure station. A phase detector senses the relative phase between the first and second beams to provide a control signal. There is at least one phase shifter in the path of at least one of the coherent beams. The control signal is coupled to the phase shifter to adjust the phase imparted thereby so that the relative phase between the first and second coherent beams is substantially constant.

12 Claims, 7 Drawing Sheets

200nm |←——→|

Photoresist Profiles Exposed
Over Anti-Reflection Layer
Without Feedback-Locking of Fringes.

200nm |←——→|

Photoresist Profiles Exposed
Over Anti-Reflection Layer
With Feedback-Locking of Fringes.

HOLOGRAPHIC LITHOGRAPHY

The Government has rights in this invention pursuant to contract Number DAAL03-86-K-0002 awarded by the Department of the Army.

This application is a continuation of U.S. Ser. No. 381,597, filed Jul. 18, 1989, now abandoned.

The present invention relates to holographic lithography. In holographic lithography a periodic or quasi periodic pattern is exposed in a photosensitive film (usually called a resist) by overlapping two beams, typically with mirrors, from a laser or other coherent source. In one particular implementation of holographic lithography, termed "achromatic holographic lithography", gratings are used to split and recombine the beams. (see E. Anderson, K. Komatsu, and H. I. Smith, "Achromatic Holographic Lithography in the Deep UV," J. Vac. Sci. Technol. B6, 216, (1988)). As a result, the source need not have the high degree of temporal coherence (i.e., narrow bandwidth) or spatial coherence commonly seen in laser sources. The minimum period, p, (i.e., center-to-center distance between adjacent lines) obtainable in holographic lithography is given by $$p = \lambda/2 \sin \theta. \quad (1)$$

where $\lambda$ is the wavelength of the exposing radiation and is half the angle between the intersecting beams. It is relatively easy to make this angle as large as 62 degrees, in which case $p = 0.57 \lambda$. The limit is, of course, $p = \lambda/2$.

Holographic lithography has been known for many years (H. I. Smith, "Fabrication Techniques for Surface-Acoustic Wave and Thin-Film Optical Devices," IEEE Proc 62, 1361-1387 (1974)). It is used commercially to produce large-area periodic diffraction gratings for spectroscopy. Prior to the advent of the laser, which made holographic lithography more practical, large area gratings were made by mechanical ruling engines, which are expensive, costly to operate, and produce well-known systematic errors, called ghosts.

Holographic lithography is also used in research, in areas ranging from distributed feedback lasers, and quantum-effect devices, to x-ray imaging and spectroscopy. Competitive means of creating periodic and quasi-periodic patterns in a resist, such as scanning-electron-beam lithography, suffer from two main shortcomings: extremely long writing times and small field-of-view. It is generally agreed that in those applications where the area of the grating exceeds about one square millimeter, and the period is finer than about one half micrometer, holographic lithography is the preferred method of exposing resists.

If one overlaps two beams from a single coherent source, such as a laser, and if environmental vibrations are sufficiently low that the beams do not move relative to one another by more than about p/2, it is nearly guaranteed that one will be able record in a resist film a recognizable diffraction grating. However, to achieve reliable and repeatable results in holographic lithography, and to do so over large area, has proven to be an extremely difficult task, and for many investigators an elusive goal.

An important object of this invention is to provide a novel means of conducting holographic lithography in which the stability in space and time of the intensity distribution at the recording place is ensured by means of a feedback loop. This invention greatly enhances the contrast in the exposing intensity distribution, as well as the reproducibility of holographic lithography. It also enables one to increase the area of exposure.

This invention results from the recognition that the quality of the "image" (i.e., the pattern of fringes and the depth of modulation) in holographic lithography is critically dependent on the phase relationship between the two (or more) beams that form the image. In this invention, there is means for directly detecting and stabilizing this phase relationship.

According to the invention, a beam-splitting optical element is above and behind a plate used to hold substrates during holographic lithography. This beam splitter intercepts portions of two beams used in holographic lithography, and produces at least two interference patterns whose variations reflect variations in the relative phase difference between the two overlapping beams. The at least two interference patterns are monitored by two photodetectors, and the difference in the output signals from the two detectors is used in a feedback loop to adjust the potential on a pockel-cell phase shifter so as to minimize this difference.

Numerous other features and advantages of the invention will become apparent from the following description when read in connection with the accompanying drawings in which.

Figure 1:
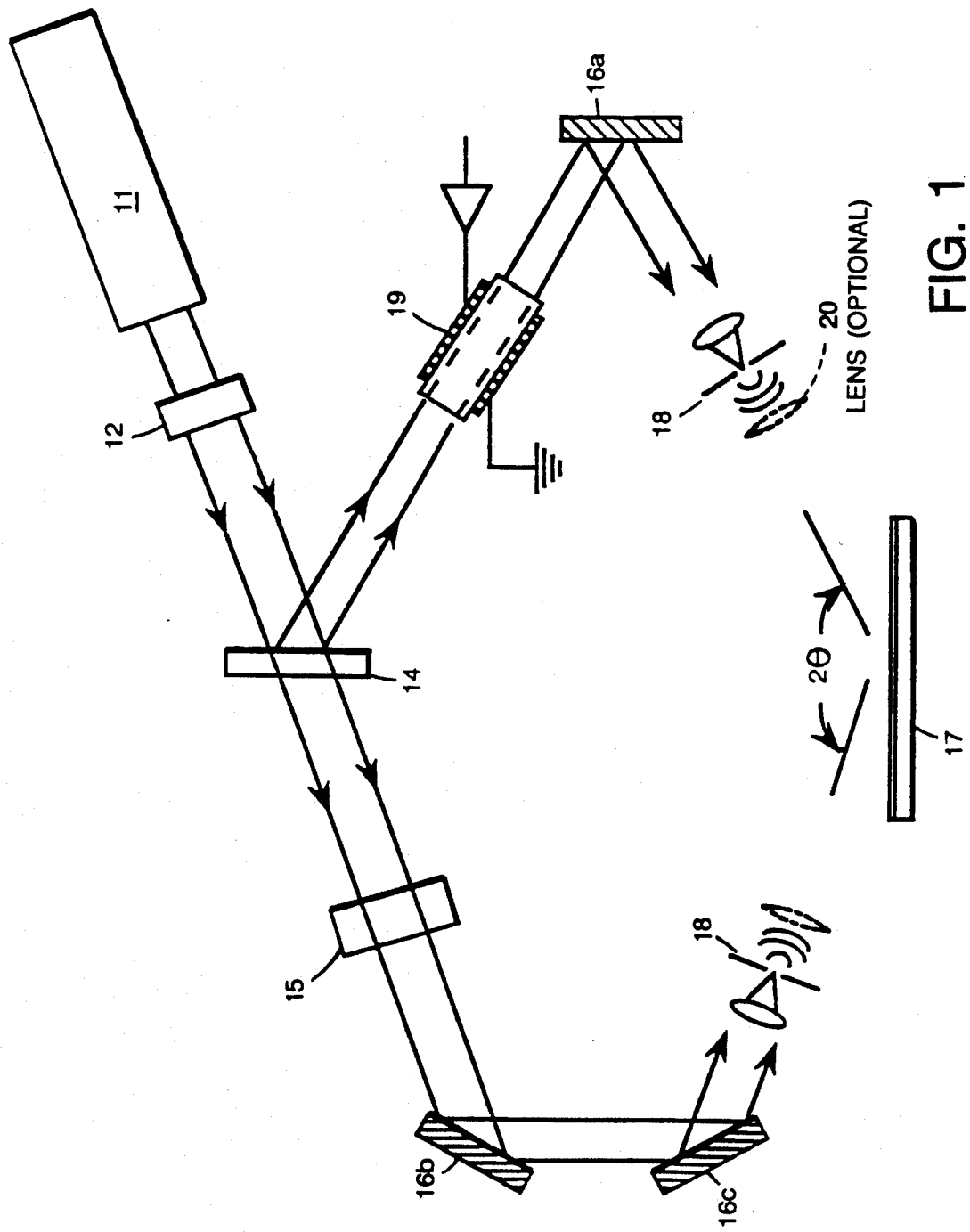
FIG. 1 is a pictorial representation of a holographic lithography system.

With reference now to the drawing and more particularly FIG. 1 thereof, there is shown a pictorial representation of a holographic lithography system.

A laser 11, such as an argon ion laser operating at the UV wavelength 351 nm, emits a beam which strikes shutter 12. Shutter 12 can be opened electronically to commence the operation of holographic lithography by directing the beam to the remainder of the apparatus, comprising an interferometer. It is typically fixed to a table of low vibration amplitude.

An advantage of this invention, because it involves active stabilization of the phase difference between interfering beams, is that it relaxes the constraints on the stability of the table to be achievable in typical lab or shop environments with a low cost table.

The interferometer comprises the beam splitter 14 which creates two beams, a variable attenuator 15 for adjusting the irradiance in one of the two beams until both match, and mirrors 16a, 16b and 16c for redirecting the beams onto the exposure station 17. In some cases, mirror 16c may be omitted. Spatial filter 18 includes a lens which focuses the laser beam onto a plane that has a single pinhole. The pinhole is chosen to be equal to the diffraction-limited focal spot of the lens. In this way, essentially pure spherical waves emanate from spatial filter 18. A collimating lens 20 (shown in dotted outline) may be placed downstream from spatial filter 18 to yield a parallel beam. However, the distance between spatial filter 18 and exposure station 17 may be sufficiently great so that lens 20 is unnecessary. The pinhole of spatial filter 18 is adjusted in position by means of a commercially available piezoelectric displacer attached to a micrometer drive (not shown) to allow for remote adjustment. Phase shifter 19 operates on the principle of a Pockell cell: application of a voltage across the cell causes a change in index of refraction and hence shifts the phase of the optical beam that is traversing the cell.

Figure 2:
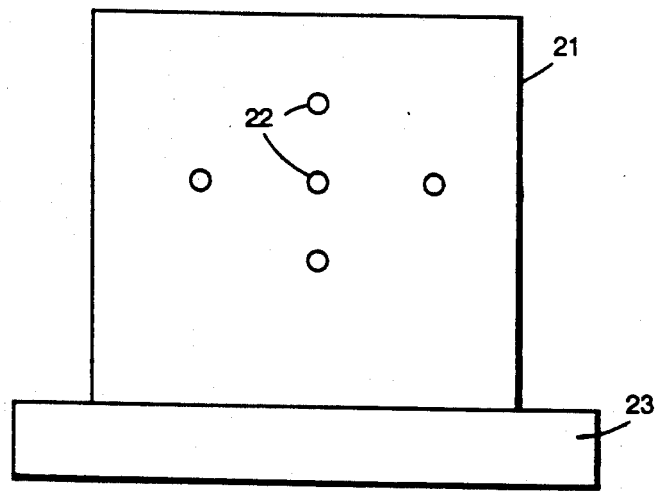
FIG. 2 is a diagrammatic representation of an exposure station.

Exposure station 17 is shown in greater detail in FIG. 2. FIG. 2 shows an arrangement of photocells 22 built into the vertical plate 21 of the exposure station. Photocells 22 are used for centering the two interfering beams on vertical plate 21. Rotary table 23 can be swung so that photocells 22 face either the right or the left beam. After such centering is completed, the substrate to be exposed is held in front of the array of photocells 22 by means of a low pressure vacuum holder or "chuck" (not shown).

Figure 3:
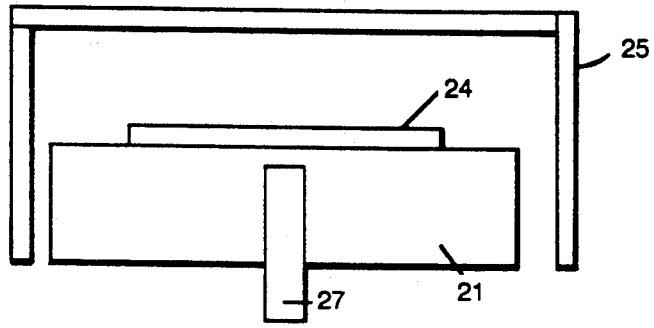
FIG. 3 is a top view of an assembly according to the invention including elements in FIG. 2.

FIG. 3 is a top view of the vertical plate 21 showing substrate 24 held onto the plate 21, a cover 25, which prevents exposure of substrate 24 during adjustment of the photodiodes 26 and the feedback loop. A beam-splitting optical flat 27 is positioned on top of vertical plate 21. In place of the optical flat one could instead use a beam splitting cube as item 27.

Figure 4A:
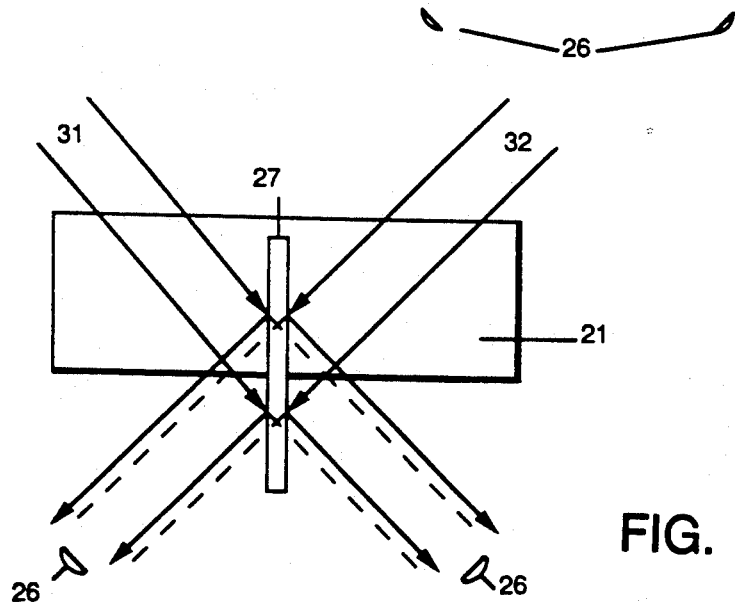
FIG. 4A and 4B show a pictorial representation illustrating the function of the beam-splitting optical flat.
Figure 4B:
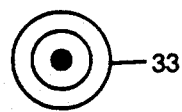
Figure 4B:
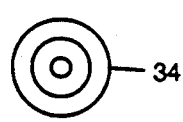
Figure 11A:
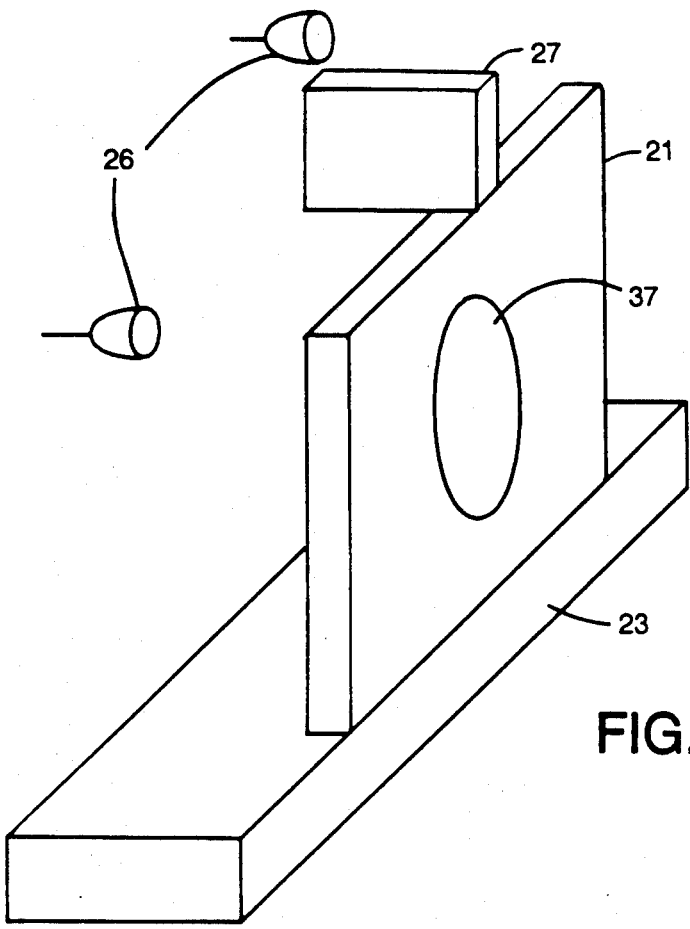
FIGS. 11A and 11B are partial pictorial perspective and front views, respectively, of structure in FIGS. 2-4 helpful in understanding the relationship of the system elements.
Figure 11B:
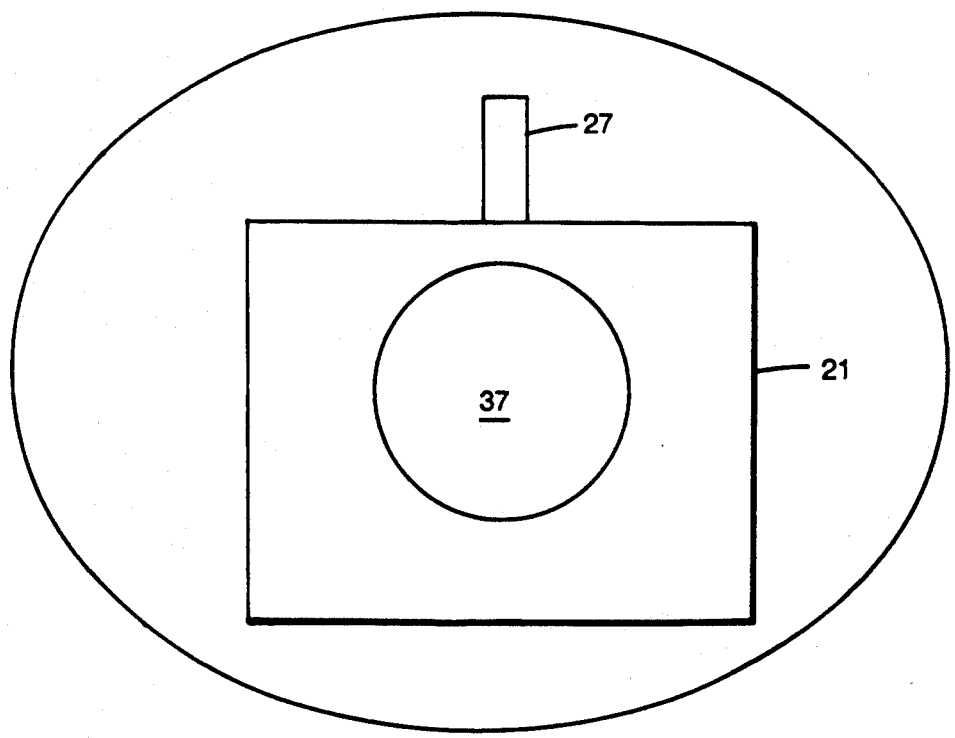

The function of the beam-splitting optical flat 27 is illustrated in FIG. 4A and 4B. The beam 31 coming in from the left is partially reflected from the flat 27 and partially transmitted (shown as dotted lines.) The beam 32 from the right is also partially reflected and partially transmitted. The interference patterns due to overlap of transmitted and reflected beams are sketched below the left and right photodiodes 26. These interference patterns are at respective locations of left and right photo diodes 26 with the path between these locations and beam splitter 27 free of optical components. These sketches show left and right "bulls-eye" patterns 33 and 34, respectively, with a dark center (left) and a bright center (right), respectively. The character of the bulls-eye pattern depends on the phase difference between left and right beams 31 and 32 and can be adjusted by applying a voltage to phase shifter 19. The photodiodes 26 are typically centered on the two bulls-eye patterns. The bulls-eye pattern is characteristic of the interference of two spherical waves of large but slightly different radii. If the left and right beams are not spherical waves, but, for example, plane waves, the interference pattern would consist of parallel fringes and can be processed as well accordingly to the invention. The relationship of system elements is helpfully illustrated in FIGS. 11A and 11B showing pictorial perspective and front views respectively of certain elements described above.

In the absence of feedback, the bulls-eye interference patterns 33 and 34 oscillate rapidly due to relative phase shifts between left and right beams. These oscillations produce brightening and darkening of the central spot and the successive rings of the bulls-eye pattern. For example, a relative phase shift of radians between left and right beams causes the central spot to change from maximum darkness to maximum brightness. A relative phase shift of 2 radians will further shift the central spot of the bulls-eye pattern back to maximum darkness. The relative phase shift between left and right beams can arise from any of several environmental factors: vibration of the interferometer table, the mirror or other components; changes in temperature; changes in the density or pressure of the air through which the beams propagate. These environmental variations are typically random and uncontrolled. Thus, changes in the interference patterns at the locations of the two photodiodes 26 reflect changes in the relative phases of the left and right interfering beams at the location of the substrate.

Figure 5A:
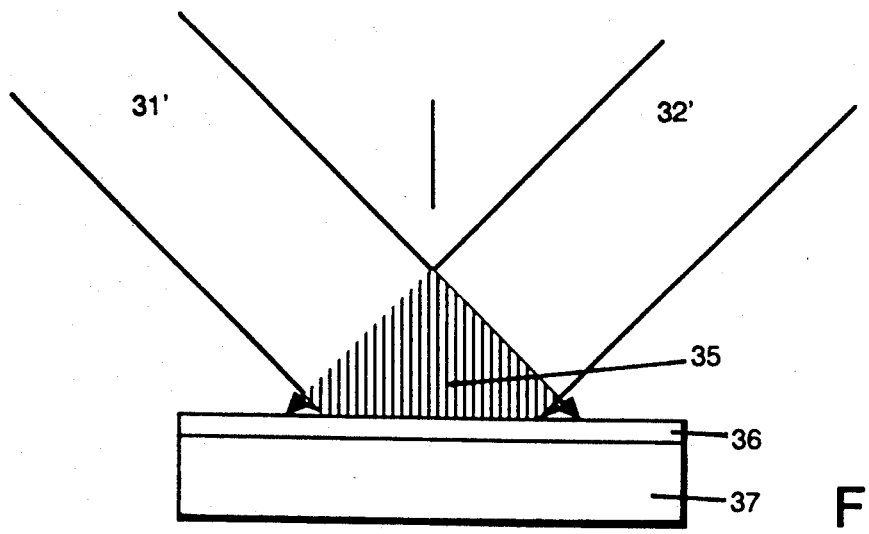
FIG. 5A is a pictorial representation of overlapping beams illustrating the principle of holographic lithography.
Figure 5B:
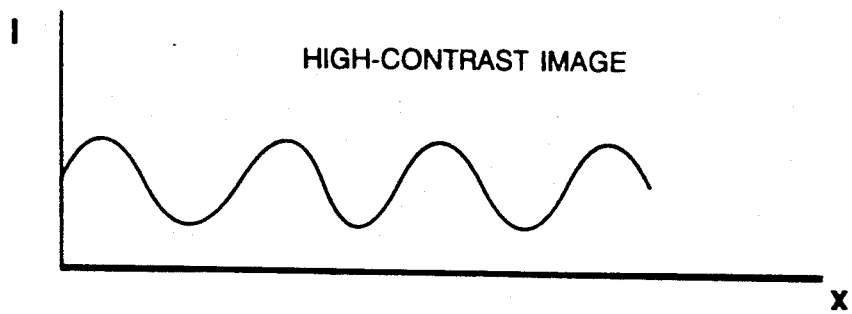
FIGS. 5B and 5C illustrate the intensity as a function of distance of high contrast and low-contrast images, respectively, produced by the interference pattern.
Figure 5C:
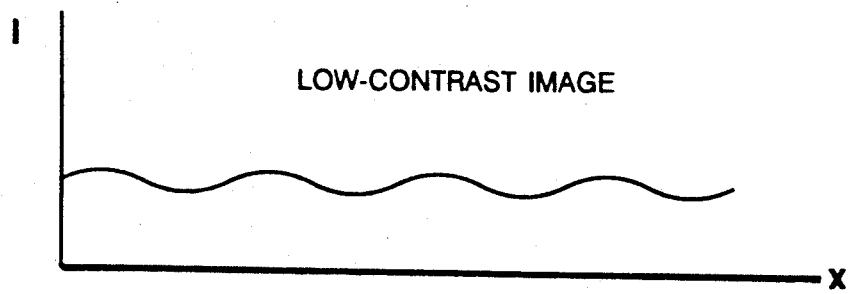

FIG. 5 depicts structure helpful in understanding a basic principle of holographic lithography. Beam 31' coming from the left overlaps with beam 32' coming from the right. In the region of overlap 35, there is an optical standing wave whose spatial period is given by equation (1) above. The vertical hatching depicts this standing wave, which consists of sinusoidally alternating dark and light fringes (i.e., regions of high and low irradiance), as plotted in the graphs of FIGS. 5B and 5C showing high-contrast and low-contrast interference patterns or holographic images, respectively. The interference pattern is recorded in the photosensitive film or resist 36.

The left and right incident beams 31, and 32, are partially reflected from substrate 37, and the interference of these reflected beams can lead to an orthogonal standing wave, as discussed in the paper by N. N. Efremow, N. P. Economou, K. Bezjian, S. S. Dana, and H. I. Smith, "A Simple Technique for Modifying the Profile of Resist Exposed by Holographic Lithography," J. Vac. Sci. Tech. 19, 1234 (1981). It is generally desirable to strongly attenuate these reflected beams.

Figure 6:
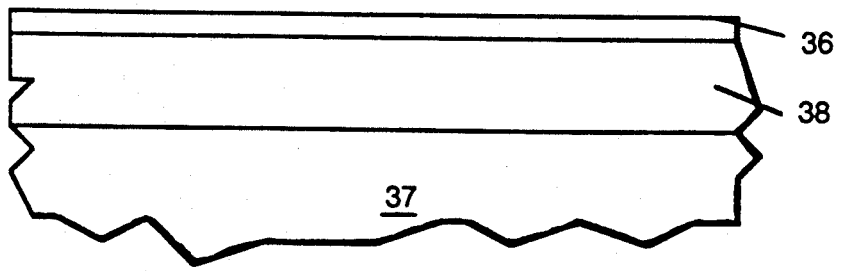
FIG. 6 is a diagrammatic representation of structure for strongly attenuating reflected beams.

To accomplish this attenuation reference is made to the configuration shown in FIG. 6. The antireflection coating 38 is a commercial product, a film which contains a dye that strongly attenuates the beams 31' and 32' as they pass through it. In this way, the resist 36 records primarily the interference due to the incoming beams 31, and 32', and only a very small remnant of the beams reflected from the substrate 37. XL, a commercial product of Brewer Scientific has been used as the ARC 38, and Microposit 1400-17, as resist 36.

Figure 7A:
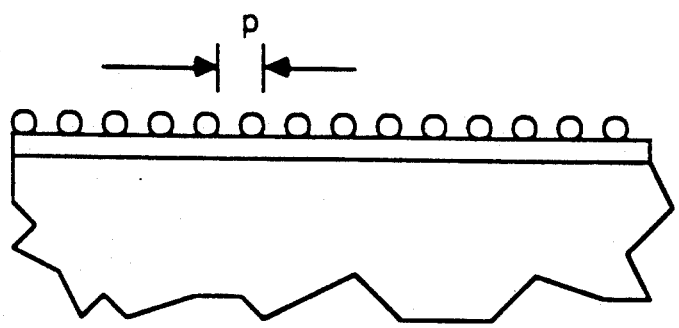
FIGS. 7A and 7B show relief structures for high and low contrast images, respectively.
Figure 7B:
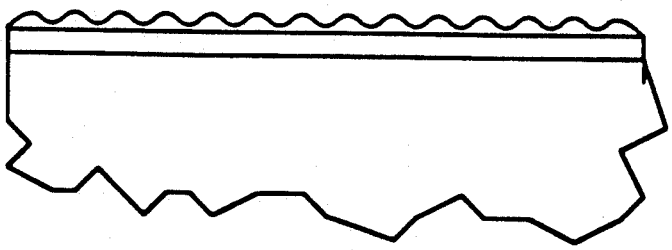

The proper exposure of the resist with a high contrast holographic image, and the subsequent development, yields a relief structure such as depicted in FIG. 7A. If the image has low contrast, a relief structure such as depicted in FIG. 7B can result. An important function of the present invention is to reliably provide a high contrast image. The contrast of the image can be degraded by many factors, including: (1) imbalance in the power density in the left and right beams; (2) a variations, over the course of the exposure, of the relative phase of the left and right beams. The former problem is easily rectified. An object of this invention is to solve the second problem in a manner that is widely applicable. Stabilizing the relative phase of the two beams greatly improves the image contrast in holographic lithography. This stabilization of the relative phase occurs according to the invention by monitoring the signals from photodiodes 26, and using these signals to control the voltage applied to the phase shifter 19 in FIG. 1. This is accomplished by a feedback loop circuit, a method well-known to anyone familiar with control electronics. The essential purpose of this circuit is to apply a voltage to phase shifter 19 such that the bullseye interference pattern remains unchanged. This, in turn, guarantees that the relative phase difference between beams 31 and 32 is unchanged.

Figure 8:
FIG. 8 is an electronmicrograph of a grating pattern in resist obtained by holographic lithography without the feedback loop in operation.
Figure 9:
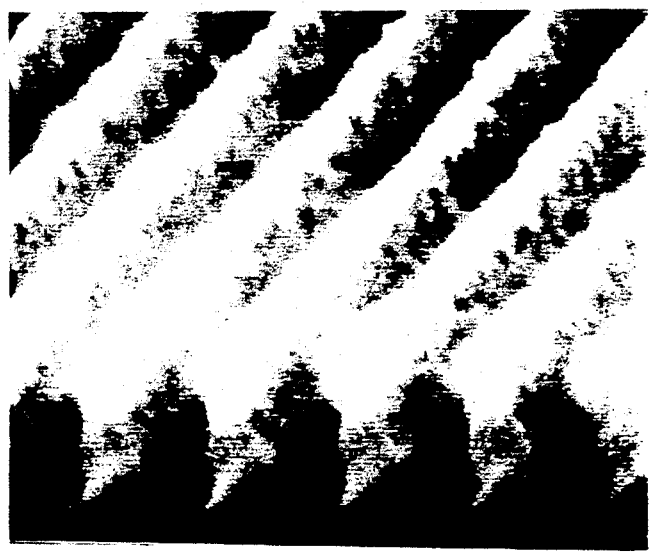
FIG. 9 is an electron micrograph of a grating pattern in resist obtained by holographic lithography with the feedback loop activated according to the invention.
Figure 10A:
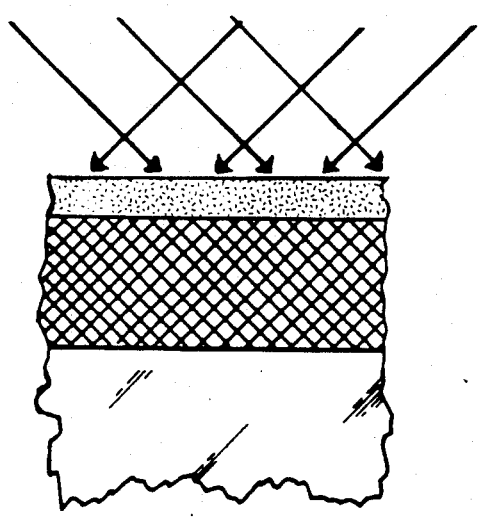
FIG. 10A-10D illustrate a process for obtaining a relief grating of higher aspect ratio.
Figure 10C:
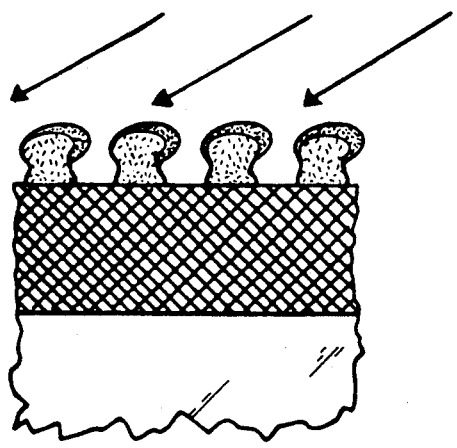
Figure 10B:
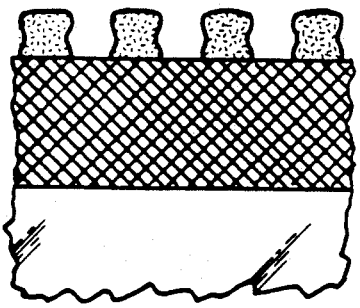
Figure 10D:
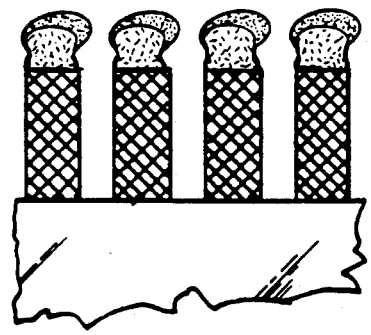

FIG. 8 is an electron micrograph of a grating pattern in resist obtained by holographic lithography without the feedback loop in operation, and FIG. 9 shows the result of activating the feedback loop.

Once the relief grating is obtained in the resist, several processes can be brought to bear to obtain a relief grating of higher aspect ratio. One such process is shown in FIG. 10A-10D. The relief structure in resist is coated at an oblique angle (so-called shadowing) with titanium, SiO or other suitable material. The substrate is then placed in a reactive-ion-etching system (commercially available) supplied with oxygen gas. Activation of the reactive-ion-etching leads to rapid etching of the polymeric ARC 38, below those areas not protected by the Ti or SiO.

Other embodiments are within the claims.

We claim:

1. A method of holographic lithography which method includes the steps of illuminating a substrate with coherent radiant energy from first and second beams, using a first beam splitter near the substrate to intercept said first and second beams to reflect a portion of the first and transmit a portion of the second beams from which the respective portions are interfered to produce thereby at least a first pattern of interference fringes at a first location with the path between said first location and said first beam splitter free of optical components, photodetecting at said first location at least said first pattern of interference fringes to provide a control signal representative of the phase difference between said first and second beams, and using said control signal to control the relative phase shift between said first and second beams to maintain the phase difference therebetween substantially constant.

2. A method of holographic lithography in accordance with claim 1 and further including the step of illuminating second beam splitter with radiant energy from a laser to form said first and second beams, establishing the intensity of said first and second beams to be of substantially equal intensity on said substrate, and maintaining the relative phase shift between said first and second coherent beams with said control signal to maintain at least said first pattern of interference fringes substantially stationary.

3. A method of holographic lithography in accordance with claim 1 and further including providing a second pattern of interference fringes by transmitting a portion of said first beam and reflecting a portion of said second beam from which the respective portions are interfered and further comprising, photodetecting said first and second patterns of interference fringes to provide first and second photodetected signals, and combining said first and second photodetected signals to provide said control signal.

4. Holographic lithographic apparatus comprising, a source of first and second coherent beams of radiant energy, an exposure station illuminated by the first and second coherent beams, at least one phase shifter in the path of at least one of said coherent beams, a first beam splitter at said exposure station arranged to reflect a portion of said first and transmit a portion of said second beams from which the respective portions are interfered to produce thereby at least a first pattern of interference fringes at a first location with the path between said first location and said first beam splitter free of optical components, at least a first radiant energy detector at said first location for detecting at least said first pattern of interference fringes which is representative of the phase difference between energy in the first and second coherent beams illuminating said exposure station to provide a control signal representative of said phase difference, and a feedback path intercoupling at least said first radiant energy detector with the phase shifter to deliver said control signal to the phase shifter which establishes the phase imparted by the phase shifter so that the relative phase between the first and second coherent beams at the exposure station remains substantially constant.

5. Holographic lithographic apparatus in accordance with claim 4 wherein said source of first and second coherent beams of radiant energy comprises, a second beam splitter, a laser illuminating said second beam splitter to provide said first and second coherent beams, a variable attenuator in the path of at least one of said first and second coherent beams, and at least said first radiant energy detector comprises at least a first photocell.

6. Holographic lithographic apparatus in accordance with claim 4 wherein said first beam splitter also provides a second pattern of interference fringes by transmitting a portion of said first beam and reflecting a portion of said second beam from which the respective portions are interfered and further comprising, a second radiant energy detector illuminated by said second pattern of interference fringes for providing a second detected signal, and a combiner for combining said first and second detected signals to provide said control signal.

7. Holographic lithographic apparatus in accordance with claim 6 wherein said combiner is a differential combiner that differentially combines said first and second detected signals to provide said control signal.

8. Holographic lithographic apparatus comprising, a source of first and second coherent beams of radiant energy, an exposure station illuminated by the first and second coherent beams, a first beam splitter arranged to reflect a portion of said first and transmit a portion of said second beam from which the respective portions are interfered to produce thereby at least a first pattern of interference fringes, at least a first radiant energy detector for detecting at least said first pattern of interference fringes which is representative of the phase difference between energy in the first and second coherent beams illuminating said exposure station to provide a control signal representative of said phase difference, and a feedback path intercoupling at least said first radiant energy detector with the phase shifter to deliver said control signal to the phase shifter which establishes the phase imparted by the phase shifter so that the relative phase between the first and second coherent beams at the exposure station remains substantially constant, wherein said source of first and second coherent beams of radiant energy comprises, a second beam splitter, a laser illuminating said second beam splitter to provide said first and second coherent beams, a variable attenuator in the path of at least one of said first and second coherent beams, and at least said first radiant energy detector comprises at least a first photocell.

9. A method of holographic lithography which method includes the steps of illuminating a substrate with coherent radiant energy from first and second beams, using a first beam splitter to intercept said first and second beams to reflect a portion of the first and transmit a portion of the second beams from which the respective portions are interfered to produce thereby at least a first pattern of interference fringes, photodetecting at least said first pattern of interference fringes to provide a control signal representative of the phase difference between said first and second beams, and using said control signal to control the relative phase shift between said first and second beams to maintain the phase difference therebetween substantially constant, and further including providing a second pattern of interference fringes by transmitting a portion of said first beam and reflecting a portion of said second beam from which the respective portions are interfered and further comprising, photodetecting said first and second patterns of interference fringes to provide first and second photodetected signals, and combining said first and second photodetected signals to provide said control signal.

10. A method of holographic lithography in accordance with claim 9 wherein said step of combining said first and second photodetected signals includes differentially combining said first and second photodetected signals to provide said control signal.

11. Holographic lithographic apparatus comprising, a source of first and second coherent beams of radiant energy, an exposure station illuminated by the first and second coherent beams, a first beam splitter arranged to reflect a portion of said first and transmit a portion of said second beams from which the respective portions are interfered to produce thereby at least a first pattern of interference fringes, at least a first radiant energy detector for detecting at least said first pattern of interference fringes which is representative of the phase difference between energy in the first and second coherent beams illuminating said exposure station to provide a control signal representative of said phase difference, and a feedback path intercoupling at least said first radiant energy detector with the phase shifter to deliver said control signal to the phase shifter which establishes the phase imparted by the phase shifter so that the relative phase between the first and second coherent beams at the exposure station remains substantially constant, wherein said first beam splitter also provides a second pattern of interference fringes by transmitting a portion of said first beam and reflecting a portion of said second base from which the respective portions are interfered and further comprising, a second radiant energy detector illuminated by said second pattern of interference fringes for providing a second detected signal, and a combiner for combining said first and second detected signals to provide said control signal.

12. Holographic lithographic apparatus in accordance with claim 11 wherein said combiner is a differential combiner that differentially combines said first and second detected signals to provide said control signal.

* * * * *

UNITED STATES PATENT AND TRADEMARK OFFICE
CERTIFICATE OF CORRECTION

PATENT NO. : 5,142,385

DATED : August 25, 1992

INVENTOR(S) : Erik H. Anderson et al

It is certified that error appears in the above-identified patent and that said Letters Patent is hereby corrected as shown below:

Column 2, line 32, "FIG." should read --FIGS.--.

Column 2, line 51, "FIG." should read --FIGS.--.

Column 3, line 44, "FIG." should read --FIGS.--.

Column 4, line 36, "31, and 32," should read --31' and 32'--.

Column 4, line 51, "31' should read --31'--.

Column 5, line 21, "FIG." should read --FIGS.--.

Column 6, line 67, claim 8, "beam" should read --beams--.

Signed and Sealed this

Sixteenth Day of November, 1993

BRUCE LEHMAN

*Attest:*

*Attesting Officer*     Commissioner of Patents and Trademarks